United States Patent [19]
Komori et al.

[11] Patent Number: 6,117,730
[45] Date of Patent: Sep. 12, 2000

[54] INTEGRATED METHOD BY USING HIGH TEMPERATURE OXIDE FOR TOP OXIDE AND PERIPHERY GATE OXIDE

[75] Inventors: Hideki Komori, Santa Clara; Kenneth Au, Fremont; Mark Ramsbey, Sunnyvale, all of Calif.

[73] Assignees: Advanced Micro Devices, Inc., Sunnyvale, Calif.; Fujitsu Limited, Kanagawa, Japan

[21] Appl. No.: 09/427,402

[22] Filed: Oct. 25, 1999

[51] Int. Cl.[7] .............................................. H01L 21/8247
[52] U.S. Cl. ............................ 438/258; 438/954; 438/261
[58] Field of Search ................................... 438/257–267, 438/954

[56] References Cited

U.S. PATENT DOCUMENTS

| | | |
|---|---|---|
| 5,104,819 | 4/1992 | Freiberger et al. . |
| 5,907,775 | 5/1999 | Tseng .......................................... 438/261 |
| 6,054,734 | 4/2000 | Aozasa et al. ............................ 257/315 |

*Primary Examiner*—Richard Booth
*Attorney, Agent, or Firm*—Brinks Hofer Gilson & Lione

[57] ABSTRACT

A process for fabricating an ONO structure for a MONOS type Flash cell having a core and a periphery includes providing a semiconductor substrate. A first silicon oxide layer is grown overlying the semiconductor substrate, and a silicon nitride layer is deposited overlying the silicon oxide layer. Before depositing a second silicon oxide layer of the ONO structure, a bit-line mask is performed for forming at least one bit-line at the core. Thereafter, an ONO mask is formed to protect the ONO structure during an etch of the periphery. After depositing and cleaning the masks for the bit-line formation and the periphery etch, the second silicon oxide layer is deposited to overlie the silicon nitride layer using an HTO deposition process. By depositing the second silicon oxide layer after forming the ONO and bit-line masks, degradation of the second silicon oxide layer is prevented, and the top silicon oxide layer maintains a high quality.

17 Claims, 3 Drawing Sheets

# INTEGRATED METHOD BY USING HIGH TEMPERATURE OXIDE FOR TOP OXIDE AND PERIPHERY GATE OXIDE

CROSS REFERENCE TO RELATED APPLICATIONS

Related subject matter is disclosed in the following co-pending and commonly assigned U.S. patent applications filed on an even date herewith, and are all herein incorporated by reference.

U.S. patent application Ser. No. 09/426,427. "METHOD OF FABRICATING A MONOS FLASH CELL USING SHALLOW TRENCH ISOLATION", (Attorney Ref. No. 09076/428).

U.S. patent application Ser. No. 09/426,405. "PROCESS FOR FABRICATING A BIT-LINE IN A MONOS DEVICE USING A DUAL LAYER HARD MASK", (Attorney Ref. No. 09076/444).

U.S. patent application Ser. No. 09/427,404. "PROCESS FOR FABRICATING A BIT-LINE USING BURIED DIFFUSION ISOLATION", (Attorney Ref. No. 09076/457).

U.S. patent application Ser. No. 09/426,743. "PROCESS FOR FORMING A BIT-LINE IN A MONOS DEVICE", (Attorney Ref. No. 09076/458).

FIELD OF THE INVENTION

The invention relates generally to the fabrication of semiconductor devices and, more particularly, to the fabrication of the dielectric layers in semiconductor devices.

BACKGROUND OF THE INVENTION

Non-volatile memory devices are currently in widespread use in electronic components that require the retention of information when electrical power is terminated. Non-volatile memory devices include read-only-memory (ROM), programmable-read-only memory (PROM), erasable-programmable-read-only memory (EPROM), and electrically-erasable-programmable-read-only-memory (EEPROM) devices. EEPROM devices differ from other non-volatile memory devices in that they can be electrically programmed and erased. Flash EEPROM devices are similar to EEPROM devices in that memory cells can be programmed and erased electrically. However, Flash EEPROM devices enable the erasing of all memory cells in the device using a single electrical current pulse.

Product development efforts in EEPROM device technology have focused on increasing the programming speed, lowering programming and reading voltages, increasing data retention time, reducing cell erasure times and reducing cell dimensions. One important dielectric material for the fabrication of the EEPROM is an oxide-nitride-oxide (ONO) structure. During programming, electrical charge is transferred from the substrate to the silicon nitride layer in the ONO structure. Voltages are applied to the gate and drain creating vertical and lateral electric fields, which accelerate the electrons along the length of the channel. As the electrons move along the channel, some of them gain sufficient energy to jump over the potential barrier of the bottom silicon dioxide layer and become trapped in the silicon nitride layer. Electrons are trapped near the drain region because the electric fields are the strongest near the drain.

A Flash device that utilizes the ONO structure is a Metal-Oxide-Nitride-Oxide-Silicon (MONOS) type cell. The MONOS type cell includes a bit-line, a word line and an ONO structure which function together to determine the location of the bit stored in memory. Important factors towards achieving high performance of the MONOS type cell include the quality and cleanliness of the ONO structure.

A problem exists with known MONOS fabrication techniques in that a quality and cleanliness of the ONO structure cannot be guaranteed during the fabrication process of the transistor. One reason that these factors cannot be guaranteed is that during production of the MONOS type cell, the top oxide layer of the ONO structure is subjected to repeated photoresist coatings and cleanings. For example, a resist layer is formed on the ONO structure to protect the device during boron and arsenic implants that underlie the bit-line. After the boron and arsenic are implanted, typically ashing and a wet clean are used to remove the resist layer. Thereafter, to form other parts of the transistor, for example, at the periphery, additional photoresist coatings and cleanings are performed on the ONO structure.

To effectively remove the resist layer, the top oxide layer should be aggressively cleaned so that an organic residue of the resist material does not contaminate the top oxide of the ONO structure. Resist material remaining on the top oxide layer of the ONO structure can adversely effect the connection between the top oxide layer and an overlying polycrystalline silicon layer of the MONOS cell to degrade performance of the cell. According to known MONOS type cell structures, however, cleaning cannot be accomplished with an aggressive acid, such as hydrofluoric acid, since the aggressive acid can degrade the top oxide layer of the ONO structure.

In sum, while there have been recent advances in EEPROM technology, numerous challenges exist in the fabrication of these devices. In particular, there is a need for an improved method of generating a MONOS type Flash cell and EEPROM technology that allows for aggressive cleaning of a top layer of the ONO structure. In addition, the improved method should ensure a high quality ONO structure, e.g., one that can withstand multiple photresist coatings and cleanings without degrading a top layer of the ONO structure.

BRIEF SUMMARY OF THE INVENTION

Such needs are met or exceeded by the present method for fabricating a MONOS type cell. The MONOS type cell includes an ONO structure that can be aggressively cleaned after ONO and bit-line mask photoresist processes are performed, and still maintain a high quality, e.g., a sufficient thickness.

More specifically, in one form, a process for fabricating an ONO structure for a MONOS type cell having a core and a periphery includes providing a semiconductor substrate. A first silicon oxide layer is grown overlying the semiconductor substrate, and a silicon nitride layer is deposited overlying the silicon oxide layer. Before depositing a second silicon oxide layer of the ONO structure, a bit-line mask is performed for forming at least one bit-line at the core. Thereafter, an ONO mask is formed to protect the ONO structure during an etch of the periphery. After depositing and cleaning the masks for the bit-line formation and the periphery etch, the second silicon oxide layer is deposited to overlie the silicon nitride layer using an HTO deposition process. By depositing the second silicon oxide layer after forming the ONO and bit-line masks, degradation of the second silicon oxide layer is prevented, and the top silicon oxide layer maintains a high quality.

BRIEF DESCRIPTION OF THE DRAWINGS

Other features and advantages of the invention will be apparent to those skilled in the art with reference to the detailed description and the drawings, of which.

Figure 1:
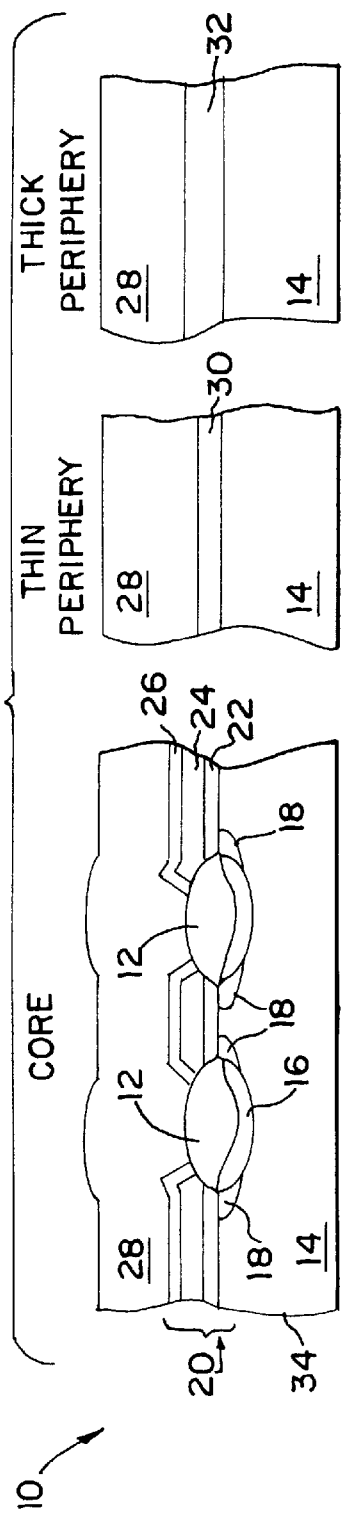
FIG. 1 illustrates, in cross-section, a portion of a semiconductor substrate containing a MONOS type transistor that incorporates an ONO structure and periphery gate oxide fabricated in accordance with the invention.

It should be appreciated that for simplicity and clarity of illustration, elements shown in the Figures have not necessarily been drawn to scale. For example, the dimensions of some of the elements are exaggerated relative to each other for clarity. Further, where considered appropriate, reference numerals have been repeated among the Figures to indicate corresponding elements.

DETAILED DESCRIPTION OF THE INVENTION

Shown in FIG. 1, in cross-section, is a transistor 10 suitable for use in EEPROM and Flash type devices. Transistor 10 includes a core portion, typically for memory, and at least one periphery portion containing the logic portion of the transistor, for example. In the core area, transistor 10 includes at least one bit-line oxide region 12 located in a semiconductor substrate 14. Bit-line oxide region 12 overlies an implanted arsenic region 16 and boron regions 18. Overlying semiconductor substrate 14 is an ONO structure 20. ONO structure 20 includes a first (or bottom) silicon oxide layer 22 directly overlying semiconductor substrate 14. A silicon nitride layer 24 overlies silicon oxide layer 22. A second (or top) silicon oxide layer 26 overlies silicon nitride layer 24. To form a word line, a polycrystalline silicon layer 28 overlies the top silicon oxide layer 26 and the bit-line region 12. In addition, the periphery area includes a thin silicon oxide layer 30 and a thick silicon oxide layer 32.

Those skilled in the art will recognize that the proper functioning of a MONOS Flash cell device necessarily requires that an electrical charge remain isolated in the regions of silicon nitride layer 24 to which it is initially introduced. In particular, the quality of ONO structure 20 must be such that charge leakage paths are minimized at the interface between the top silicon oxide layers 26 and the polycrystalline silicon layer 28. In accordance with the invention, charge leakage within ONO structure 20 is minimized by forming a high quality top silicon layer oxide layer 26. The reduced charge leakage obtained by the present invention can be better understood following a description of an MONOS fabrication process carried out in accordance with the invention.

Figure 2:
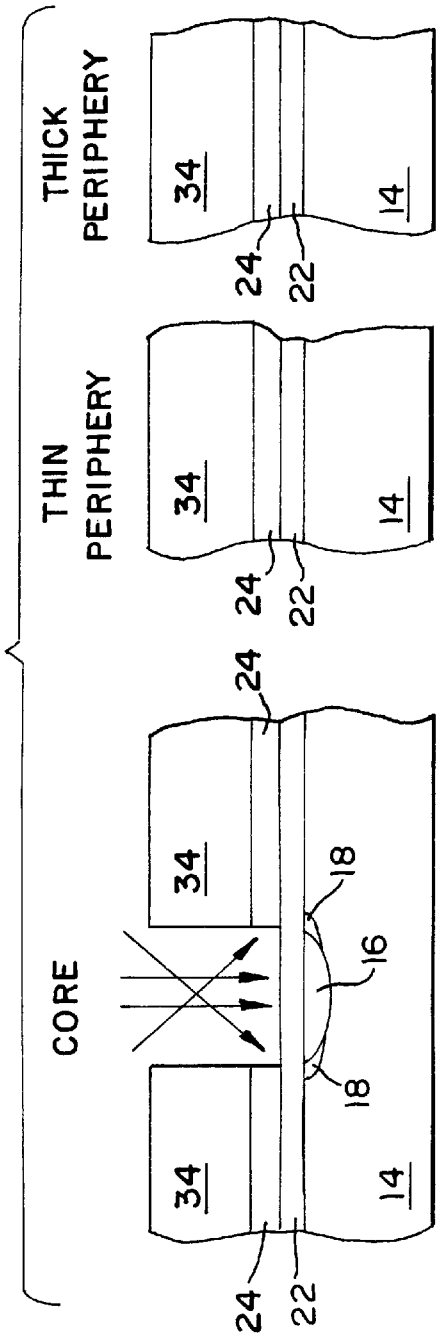
FIGS. 2–7 illustrate, in cross-section, process steps for the fabrication of the ONO structure and the periphery gate oxide in accordance with the invention.

Referring to FIG. 2, silicon oxide layer 22 is formed to overlie the surface of semiconductor substrate 14. Preferably, semiconductor substrate 14 is a single crystal silicon substrate. Semiconductor substrate 14 has an upper surface 34 previously processed to remove debris and native oxides. Preferably, the bottom silicon oxide layer 22 is formed by thermally oxidizing surface 34 at an elevated temperature in the presence of dry molecular oxygen. Preferably, the oxidation process is carried out at a temperature of about 800 to about 1400° C. The oxidation process forms a silicon oxide layer preferably having a thickness of about 60 to about 80 angstroms, and more preferably a thickness of about 70 angstroms. The oxidation process can be carried out in either a batch-type thermal oxidation furnace, or alternatively, in a single-wafer oxidation apparatus.

After forming the silicon oxide layer 22, the silicon nitride layer 30 is formed to overlie the bottom silicon oxide layer 22. Preferably, silicon nitride layer 22 is formed by means of a low-pressure-chemical-vapor-deposition (LPCVD) process. The process is carried out for a period of time and at gas flow rates sufficient to form a silicon nitride layer preferably having a thickness of about 50 to about 100 angstroms. Those skilled in the art will appreciate that other processes can be used such as a rapid-thermal-chemical-vapor-deposition (RTCVD) process.

Referring to FIG. 2, according to an embodiment of the present invention, after forming the silicon nitride layer 24, and before forming the top oxide layer 26, the bit line is masked, for example, with a photoresist process which produces a first resist layer 34. Thereafter, a boron implant is performed to form the boron regions 18. After the boron regions 18 are formed, a bit line etch is performed which removes the silicon nitride layer 24 from the bit line area. Those skilled in the art should appreciate that the bit-line etch is simplified since the ONO structure is etched before the top oxide layer is deposited. After the bit line etch, arsenic is implanted to form the arsenic region 16.

Figure 3:
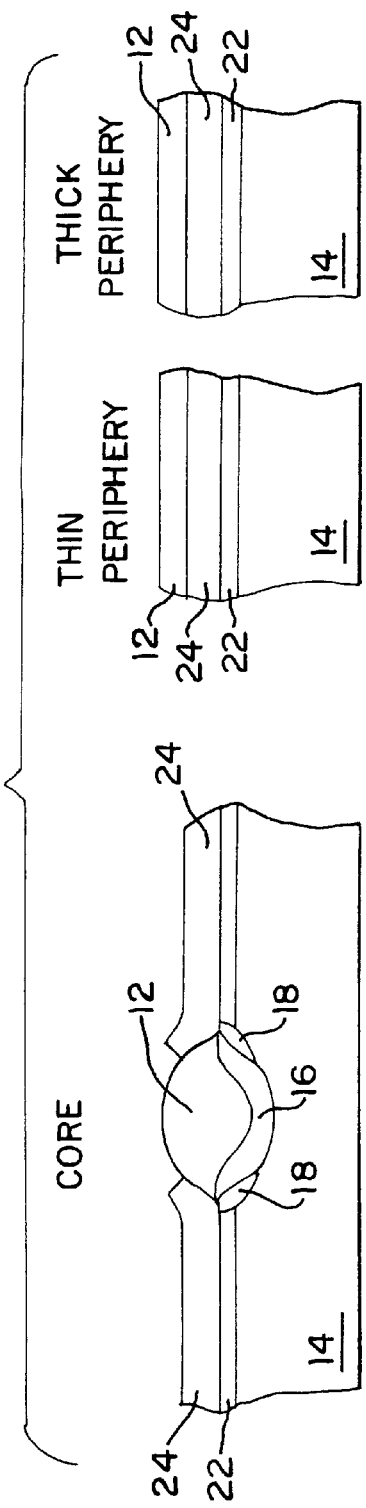

Referring to FIG. 3, after the boron and arsenic implants, the first resist layer 34 is removed. Since the top oxide layer 26 remains to be deposited, the first resist layer 34 can be aggressively removed with, for example, amonia peroxide. After the first resist layer 34 is removed, bit line oxidation is performed to form the bit line oxide layer 12.

Figure 4:
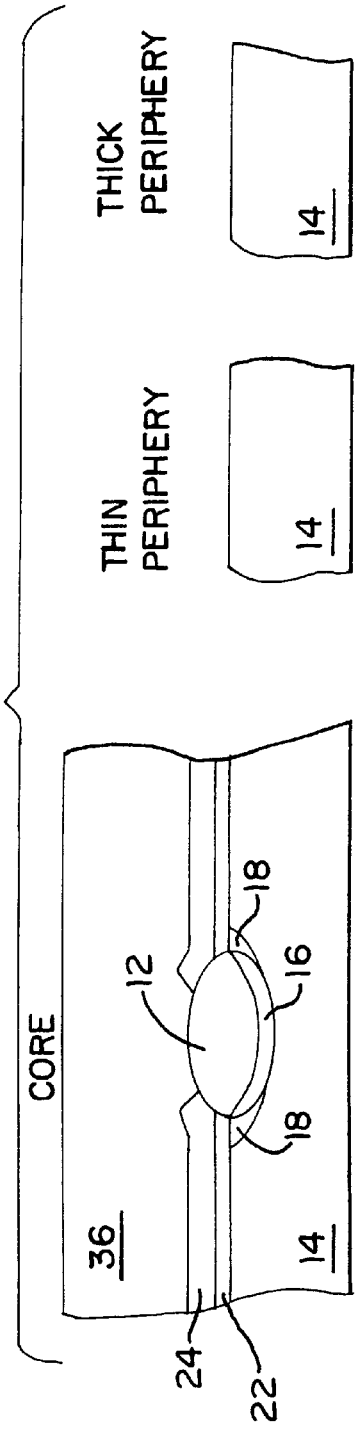

Referring to FIG. 4, after the bit line oxidation is performed, the core is masked with, for example, a second resist layer 36. Thereafter, the bit line oxide layer 12, the silicon nitride layer 24 and the bottom silicon oxide layer 22 are removed from the periphery to leave only the semiconductor substrate 14 on the periphery. Those skilled in the art should appreciate that the layers can be removed with dry etching, for example.

Figure 5:
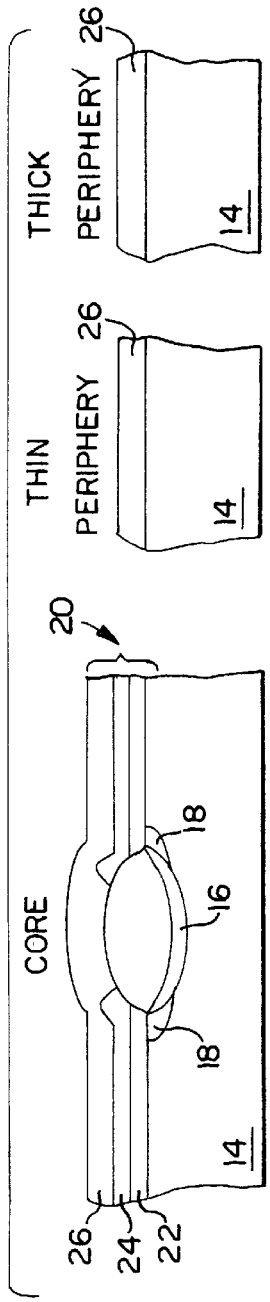

Referring to FIG. 5, after removing the layers from the periphery, the second resist layer 36 is removed from the core. As described above, since the top oxide layer 26 remains to be deposited, the second resist layer 36 can be aggressively removed with, for example, amonia peroxide. Thereafter, the top silicon oxide layer 26 is deposited. Preferably, the top silicon oxide layer 26 is deposited using a high-temperature-oxide (HTO) process. The HTO deposition process is carried out at a temperature of about 750 to about 800° C.

Figure 6:
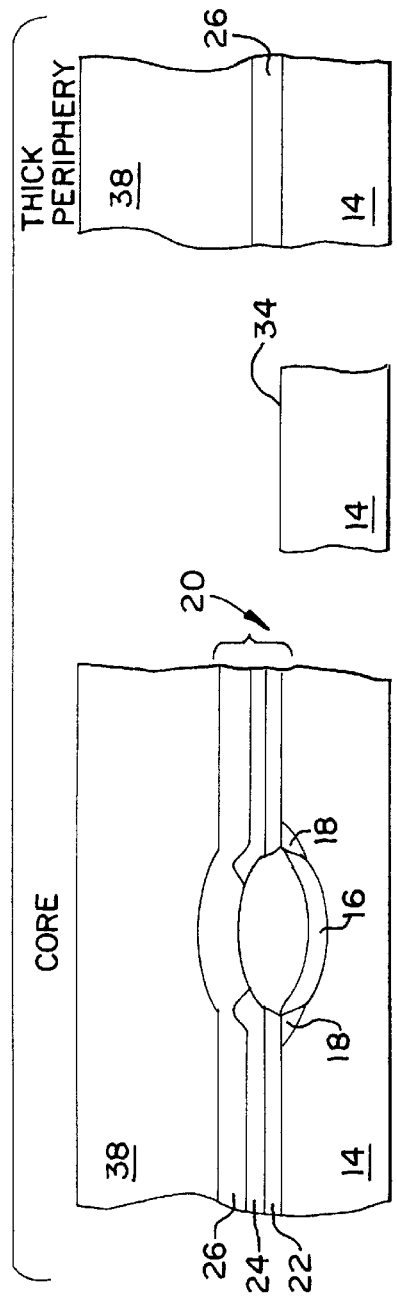

Referring to FIG. 6, after the HTO process is performed, the core and the thick periphery are masked with a third resist layer 38 and the silicon oxide deposited on the thin periphery is removed, preferably with a wet etch to avoid damaging the semiconductor substrate 14. In this manner, to form a gate oxide, thin and thick silicon oxide layers are formed at the periphery, as described below. The double thickness periphery allows for a more reliable gate oxide since the stacked gate oxide lowers the possibility of defects in both layers of the silicon oxide.

Figure 7:
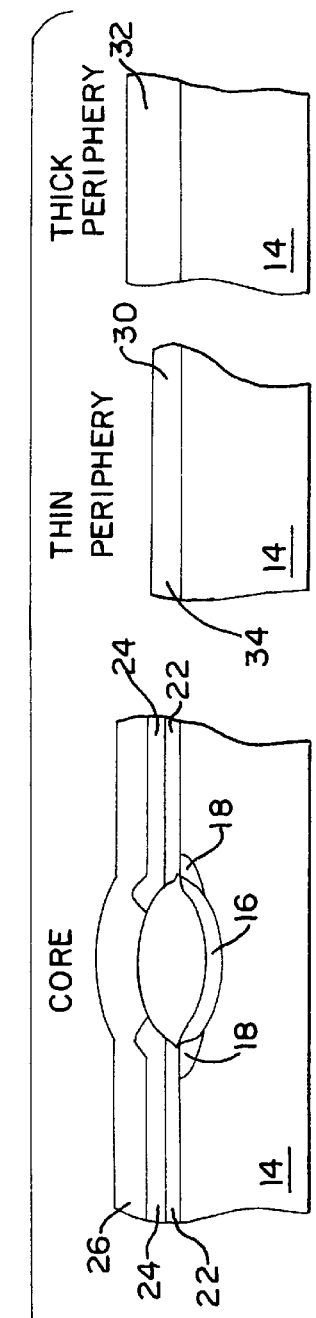

Referring to FIG. 7, after the thin periphery etch is performed, the third resist layer 38 is removed. Thereafter, a silicon oxidation step is performed at both the core and the periphery. Silicon oxide is deposited by thermally oxidizing surface 34, the top silicon oxide layer 26 and the thick silicon oxide layer 32 at an elevated temperature in the presence of dry molecular oxygen. Preferably, the oxidation process is carried out at a temperature of about 1000° C. The oxidation process forms a silicon oxide layer preferably having a thick silicon oxide layer 32 thickness of about 150 angstroms and a thin silicon oxide layer 30 thickness of about 100 angstroms. The oxidation process can be carried out in either a batch-type thermal oxidation furnace, or alternatively, in a single-wafer oxidation apparatus. Alternatively, a steam oxidation process can be carried out at a temperature of about 800 to about 900° C. for a time period sufficient to achieve silicon oxide layers having the above described thickness.

Referring back to FIG. 1, after the silicon oxide is formed, oxidation is performed to form the polycrystalline silicon layer 28. The polycrystalline silicon layer is part of a word-line of the transistor, for example. Thereafter, the MONOS type flash cell can be completed using steps known to those skilled in the art.

From the foregoing description, it should be understood that an improved method of generating a MONOS type flash cell has been shown and described which has many desirable attributes and advantages. A step of the known process is eliminated since oxidation of the top silicon oxide layer 26 and periphery oxidation are combined. In addition, degradation of the top silicon oxide layer 26 is prevented since oxidation of the top silicon oxide layer 26 occurs after photoresist and clean processes are performed for the bit-line implant and the periphery gate oxide pre-clean. Therefore, more margin is allowed for the periphery gate oxide clean and the bit-line oxide loss.

It is to be understood that changes and modifications to the embodiments described above will be apparent to those skilled in the art, and are contemplated. It is therefore intended that the foregoing detailed description be regarded as illustrative rather than limiting, and that it be understood that it is the following claims, including all equivalents, that are intended to define the spirit and scope of this invention.

What is claimed is:

1. A process for fabricating an ONO structure for a MONOS type Flash cell device, the MONOS type cell having a core and a periphery, the process comprising the steps of:

providing a semiconductor substrate;

growing a first silicon oxide layer overlying said semiconductor substrate;

forming a silicon nitride layer overlying said silicon oxide layer;

forming a bit-line mask to form at least one bit-line at the core;

forming an ONO mask to protect the ONO structure during an etch of the periphery; and after forming said bit line and ONO masks,—has been inserted;

depositing a second silicon oxide layer overlying said silicon nitride layer using an HTO deposition process.

2. The process according to claim 1 wherein the HTO deposition process is carried out at a temperature of about 750 to about 800° C.

3. The process according to claim 1, wherein the step of depositing a silicon nitride layer comprises low-pressure-chemical-vapor-deposition.

4. The process according to claim 1 further including the step of depositing silicon oxide at both the core and the periphery after the step of performing the HTO deposition.

5. The process according to claim 4 wherein the silicon oxide is deposited by thermal oxidation at an elevated temperature in the presence of dry molecular oxygen.

6. The process according to claim 5 wherein the thermal oxidation process is carried out at a temperature of about 1000° C.

7. The process according to claim 4 wherein the step of depositing the silicon oxide comprises using a steam oxidation process carried out at a temperature of about 800 to about 900° C.

8. The process according to claim 4 wherein the thermal oxidation process forms a silicon oxide layer preferably having a thickness of about 150 angstroms at a thick periphery and a thickness of about 100 angstroms at a thin periphery.

9. The process according to claim 4 further including the step of forming a polycrystalline silicon layer to overlie said second silicon oxide layer after the step of depositing silicon oxide is performed.

10. A process for fabricating a MONOS type Flash cell device including an ONO structure, the process comprising the steps of:

providing a semiconductor substrate having at least one bit-line oxide layer;

forming an ONO layer on the substrate surface region by first, thermally growing a first silicon oxide layer on the substrate surface region, second, forming a silicon nitride layer overlying the first silicon oxide layer; third, forming a bit-line mask to form at least one bit-line at the core, fourth, forming an ONO mask to protect the ONO structure during an etch of the periphery, and fifth, depositing a second silicon oxide layer overlying said silicon nitride layer;

wherein said second silicon oxide layer is deposited using an HTO deposition process carried out at a temperature of about 750 to about 800° C.

11. The process according to claim 10, wherein the step of depositing a silicon nitride layer comprises low-pressure-chemical-vapor-deposition.

12. The process according to claim 10 further including the step of depositing silicon oxide at both the core and the periphery after the step of performing the HTO deposition.

13. The process according to claim 12 wherein the silicon oxide is deposited by thermal oxidation at an elevated temperature in the presence of dry molecular oxygen.

14. The process according to claim 13 wherein the thermal oxidation process is carried out at a temperature of about 1000° C.

15. The process according to claim 12 wherein the step of depositing the silicon oxide comprises using a steam oxidation process carried out at a temperature of about 800 to about 900° C.

16. The process according to claim 12 wherein the thermal oxidation process forms a silicon oxide layer preferably having a thickness of about 150 angstroms at a thick periphery and a thickness of about 100 angstroms at a thin periphery.

17. The process according to claim 12 further including the step of forming a polycrystalline silicon layer to overlie said second silicon oxide layer after the step of depositing silicon oxide is performed.

* * * * *